United States Patent
Kanamaru

(10) Patent No.: US 9,160,157 B2
(45) Date of Patent: Oct. 13, 2015

(54) ELECTRONIC CIRCUIT

(75) Inventor: Hiroko Kanamaru, Kobe (JP)

(73) Assignee: GVBB HOLDINGS S.A.R.L., Luxembourg (LU)

( * ) Notice: Subject to any disclaimer, the term of this patent is extended or adjusted under 35 U.S.C. 154(b) by 13 days.

(21) Appl. No.: 13/816,486

(22) PCT Filed: Aug. 10, 2011

(86) PCT No.: PCT/JP2011/004545
§ 371 (c)(1),
(2), (4) Date: Sep. 10, 2013

(87) PCT Pub. No.: WO2012/020571
PCT Pub. Date: Feb. 16, 2012

(65) Prior Publication Data
US 2013/0342944 A1    Dec. 26, 2013

(30) Foreign Application Priority Data

Aug. 10, 2010    (JP) .................................. 2010-179166

(51) Int. Cl.
*H02H 5/04*    (2006.01)
*H02H 3/08*    (2006.01)
*H03K 19/003*    (2006.01)

(52) U.S. Cl.
CPC ........... *H02H 3/08* (2013.01); *H03K 19/00315* (2013.01)

(58) Field of Classification Search
USPC .......................................................... 361/106
See application file for complete search history.

(56) References Cited

U.S. PATENT DOCUMENTS

| | | | |
|---|---|---|---|
| 6,078,092 A | 6/2000 | Wang | |
| 7,375,498 B2 * | 5/2008 | Yamamoto | 320/150 |
| 2006/0227480 A1 * | 10/2006 | Zhou et al. | 361/103 |
| 2006/0268645 A1 | 11/2006 | Graf | |

FOREIGN PATENT DOCUMENTS

| | | |
|---|---|---|
| JP | 6085179 A | 3/1994 |
| JP | 2004-114821 | 4/2004 |
| JP | 2009-163409 | 7/2009 |
| WO | 2009/084293 A1 | 7/2009 |
| WO | 2012020571 A1 | 2/2012 |

OTHER PUBLICATIONS

International Search Report for International Application No. PCT/JP2011/004545 mailed by the European Patent Office on Nov. 15, 2011 (4 pages).
Written Opinion for International Application No. PCT/JP2011/004545 mailed by the European Patent Office on Nov. 15, 2011 (6 pages).
Notice of Reasons for Rejection dated Jul. 1, 2014 regarding Japan Application No. 2010-179166.
Notice of Reasons for Rejection mailed Dec. 16, 2014, regarding Japan Application No. JP 2010-179166.

* cited by examiner

*Primary Examiner* — Dharti Patel
(74) *Attorney, Agent, or Firm* — Arent Fox LLP

(57) ABSTRACT

An electronic circuit is provided that has a function of protecting an IC element (10) from excess current cause by latch-up. The electronic circuit includes an IC element (10) having a terminal (N1) connecting to power voltage (VCC) and a terminal (N2) connecting to ground voltage, and an automatic reset fuse (11) that is connected to either of the terminals.

10 Claims, 5 Drawing Sheets

ELECTRONIC CIRCUIT

TECHNICAL FIELD

The present invention generally relates to an electronic circuit, and particularly relates to an electronic circuit provided with an overcurrent protection function.

BACKGROUND ART

When connecting like devices by way of a cable, current called surge current may flow in a signal line or ground line due to the ground potential difference of like devices or the potential difference from electrical charge accumulation such as electrostatic charge. A driver device on the transmission side or receiver device on the receiving side provided inside the device may be damaged from this surge current flowing therein.

Conventionally, a protection diode has been used in order to prevent device damage arising from surge current. By connecting a protection diode between a signal line or ground line and the power source, it is possible to release the surge current to the power source. A Schottky diode, varistor or the like have been used as protection diodes.

By providing a protection diode, it is possible to prevent a device from being damaged by this surge current to some extent. However, the possibility for latch-up to occur in the device cannot be completely eliminated. When latch-up occurs in a device, excessive current flows between the positive-side power voltage and the ground-side power voltage of the device, and thus the device generates heat and is damaged by this excessive current.

As an example of a protection circuit against excessive current, Patent Literature 1 discloses a configuration that generates supply voltage to be supplied to a CPU by way of a three-phase voltage supply circuit, in which the configuration provides a resettable fuse on the power voltage side of power control modules of the respective three phases. More specifically, modules that alternately turn ON and OFF MOSFETs on a high (HIGH) side and low (LOW) side to generate a PWM waveform are provided in the three phases, and the outputs of the three-phase are coupled thereto, further smoothed with an inductor and capacitor, and then supplied as power voltage to a CPU. In this configuration, a resettable fuse is inserted in each of the three paths supplying power voltage to the three modules generating PWM waveforms.

With the technology described in Patent Literature 1, the resettable fuses (70, 71, 72) are arranged just before the voltage control modules (20, 30, 40), and are not directly connected to the CPU (60); therefore, latch-up of the CPU cannot be prevented.

Patent Literature 2 discloses a configuration providing a latch-up protection circuit in a path supplying power voltage to an internal circuit of an integrated-circuit chip. This latch-up protection circuit switches OFF an on-chip voltage regulator supplying electric power to the internal circuit if the current supplied to the internal circuit exceeds a predetermined set value. This configuration is a configuration that has a circuit for latch-up protection built into the integrated-circuit chip, whereby an IC element equipped with a latch-up protection function is provided.

With the technology described in Patent Literature 2, there is a problem in that it is necessary to build the latch-up protection circuit into the integrated-circuit chip in advance, and it cannot be applied to an integrated-circuit without a latch-up protection circuit built in. In addition, building the latch-up protection circuit into the integrated-circuit leads to increased costs in the design of the integrated-circuit and fabrication steps.

CITATION LIST

Patent Literature

Patent Literature 1: US Patent Application Publication No. 2006/0227480

Patent Literature 2: Japanese Unexamined Patent Application Publication No. H6-85179

SUMMARY OF INVENTION

Problems to be Solved by the Invention

Taking into account the aforementioned such conventional problems, an electronic circuit having a function of protecting an IC element from excessive current caused by latch-up is desirable.

Means for Solving the Problems

In accordance with one aspect of the present invention, there is provided an electronic circuit including: an IC element having a terminal connecting to power voltage and a terminal connecting to ground voltage; and an automatic reset fuse connected to either one of the terminals.

Effects of Invention

According to the disclosed electronic circuit, an automatic reset fuse enters a cut-off state when latch-up occurs in an IC element and high current is allowed to flow from the power voltage to ground voltage, whereby it is possible to prevent the IC element from generating heat and being destroyed. The automatic reset (resettable) fuse automatically returns to a conductive state when latch-up is eliminated or the power source is turned off. Therefore, a latch-up protection function that does not require a manual operation in the recovery operation can be provided in a focused manner to an IC element for which latch-up easily occurs.

EXPLANATION OF REFERENCE NUMERALS

Figure 1:
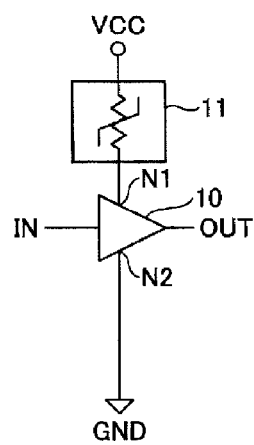
FIG. 1 is a view showing an example of an electronic circuit having a function of protecting an IC element from excessive current caused by latch-up.

10 IC element
11, 12 automatic reset fuse 21, 22 electronic device
23 communication cable
24, 25 connector
26 driver IC
27 automatic reset fuse
28, 29 protection diode
30 receiver IC
31 automatic reset fuse
32, 33 protection diode
40 driver IC
41, 43 automatic reset fuse
42 receiver IC
51, 52
53 communication cable
54, 55 connector
56 driver IC
57, 63 automatic reset fuse
58 to 61 protection diode
62 receiver IC
64 to 67 protection diode
71 power supply unit
72 power plug
73 fuse
74-1 to 74-3 DC-DC converter
75-1 to 75-9 IC element
76 driver IC
77 receiver IC
78, 79 automatic reset fuse
100 IC
101 automatic reset fuse
102 fuse
103 communication terminal
104 substrate

PREFERRED MODE FOR CARRYING OUT THE INVENTION

Hereinafter, embodiments of the present invention will be explained with reference to the appended drawings.

FIG. 1 is a view showing an example of an electronic circuit having a function of protecting an IC element from excessive current caused by latch-up. The electronic circuit shown in FIG. 1 includes an IC element 10 and an automatic reset fuse 11. The IC element 10 has a terminal N1 connected to a power voltage VCC and a terminal N2 connected to a ground voltage GND. The automatic reset fuse 11 may be connected to either one of the terminal N1 and N2. In the example of FIG. 1, the automatic reset fuse 11 is connected to the terminal N1, and is inserted between the IC element 10 and the power voltage VCC.

Figure 2:
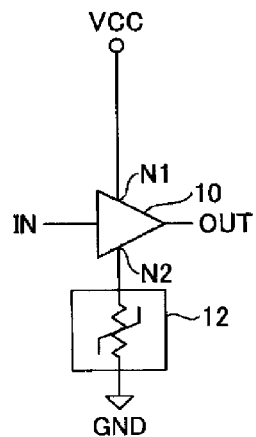
FIG. 2 is a view showing another example of an electronic circuit having a function of protecting an IC element from excessive current caused by latch-up.

FIG. 2 is a view showing another example of an electronic circuit having a function of protecting the IC element from excessive current caused by latch-up. In FIG. 2, the same components as FIG. 1 are referred to by the same numbers, and explanations thereof will be omitted as appropriate. In the example of FIG. 1, the automatic reset fuse 11 is inserted between the IC element 10 and the power voltage VCC; whereas, in the example of FIG. 2, an automatic reset fuse 12 is provided between the IC element 10 and the ground voltage GND.

In the examples of FIGS. 1 and 2, the IC element 10 is an element with the potential for latch-up to occur, e.g., a CMOS (complementary MOS) element. In a case of being an element composed of CMOS, latch-up can occur as explained below. With a CMOS device, for example, the P-well and the source and drain of P-channel transistor are formed in an N-type substrate, and the source and drain of the N-channel transistor are formed on the P-well. For example, a PNP-type bipolar transistor is formed as a parasitic element by the source or drain of a P-channel transistor, an N-type substrate, and a P-well. In addition, an NPN-type bipolar transistor is formed by an N-type substrate, a P-well and the source or drain of an N-channel transistor. These parasitic elements are combined to form a parasitic thyristor structure of a PNP junction. When a trigger current is flowed to the gate portion of the parasitic thyristor due to power voltage variation, surge current, or the like, latch-up occurs thereby causing the parasitic thyistor to enter the ON state. When latch-up occurs, high current continuously flows between the power voltage VCC and ground voltage GND as long as the power is not turned OFF. As a result, a great deal of heat generation occurs stemming from the ON resistance of the parasitic transistor, the silicon burns, wires melt, and the device is destroyed.

In the electronic circuits shown in FIGS. 1 and 2, although the function of protecting from overcurrent is not built into the IC element 10, the automatic reset fuse 11 or automatic reset fuse 12 is connected thereto. Therefore, even if the IC element 10 brings on latch-up and high current passes from the power voltage VCC to the ground voltage GND, the automatic reset fuse 11 or 12 will temporarily cut off this high current, and can protect the IC element 10 from heat generation due to the high current. Herein, the automatic reset fuse enters a cut-off state with a predetermined current as a trigger, after which it returns to a conductive state without there being an intervening action from outside. Automatically returning without there being an intervening action from outside is the matter of going back to the conductive state spontaneously when a time elapses, without physically executing a recovery action such as a repair action like fuse replacement or throwing a switch by hand or caused by an instruction from a human. In a case of the cause for flowing high current remaining in such a state, the cut-off state may not be released, or even if automatically returned to the conductive state, high current will be allowed to flow and it may transition to the cut-off state again.

The automatic reset fuses 11 and 12 may be resettable fuses composed of a PTC (Positive Temperature Coefficient) element. The PTC element is an electronic element that assumes a behavior such that the resistance value increases when the temperature rises. When inserted in series in the power source of the protected circuit, although a temperature rise is induced by the operating current of the circuit, at current values within the normal operating range, the resistance value will not become so large as to affect the operation of the protected circuit or to stop operation thereof. If overcurrent is allowed to flow to the protected circuit due to some kind of abnormality such as latch-up, the temperature of the PTC element will rapidly rise and the resistance value will rapidly increase, a result of which a state will be entered in which only a small amount of current will pass. This state is the same state as when a fuse has blown, i.e. a cut-off state, and thus the protected circuit can be protected from damage due to heat generation. In a case of the small amount of current being sufficient to maintain a high temperature of the PTC element, the high resistance state will be maintained so long as the cause of overcurrent is not eliminated or the power source is not turned OFF. Even in a case of the temperature gently falling with a slight amount of current, since it will act such that when the resistance value decreases along with the temperature decline, the current will increase and return to a large resistance value, the PTC element can maintain a high resistance state so long as the cause of overcurrent is not eliminated or the power source is not turned OFF. If the cause of the overcurrent is eliminated or the power source is turned off and the temperature declines, the PTC element will return to a state in which the resistance value is small, and allow the normal operating current to flow. If a case in which latch-up is the cause of the overcurrent, the parasitic thyristor can be turned OFF to release the latch-up state by adequately decreasing the current value flowing to the circuit or turning OFF the power source.

Since there is no necessity for replacement like a fuse if using such a resettable fuse, even after an abnormality arises and a cut-off state has been entered, the labor and cost of repair and replacement can be reduced. The resettable fuse is called a PolySwitch (registered trademark), OptiReset (registered trademark), Everfuse (registered trademark), Polyfuse (registered trademark), Multifuse (registered trademark) or the like depending on the maker. It should be noted that an element such that cuts off the appropriate power source in response to a detection result of a current flowing in the power source may be configured by an electronic circuit, and may be used as the automatic reset fuse 11 or 12. For example, a resistor of extremely low value may be inserted in series with the power source, and the current may be detected from the minute voltage generated over both terminals of this resistor. When the detected current exceeds a predetermined range, it is determined that overcurrent is flowing, and a switch may be provided so that the power source is cut off.

It should be noted that, when overcurrent is allowed to flow to the IC element 10 and the automatic reset fuse 11 or 12, not only does the automatic reset fuse 11 or 12 become high temperature, but the temperature of the IC element 10 is also considered to rise to some extent. In this case, if the IC element 10 and the automatic reset fuse 11 or 12 are disposed to be close, the rate of temperature decline from spontaneous heat dissipation will be delayed for each. Therefore, in order to achieve fast automatic reset, the distance between the IC element 10 and the automatic reset fuse 11 or 12 is preferably separated to an extent that the heat from spontaneous heat dissipation will not easily transmit from one to the other.

The above-mentioned latch-up can occur generally due to power voltage variation, surge current, or overshoot of a signal level. In particular, in a case of the IC element 10 being a driver or receiver of an interface for communication used for communication between devices, the risk is high for latch-up to occur. This is because, when connecting like devices, a surge current is allowed to flow in the power line, signal line, ground line, or the like due to the potential difference of the respective grounds and the potential difference from electric charge accumulation such as static electricity, and latch-up can occur with this surge current as a trigger. From the examples of FIGS. 1 and 2, in the case of the IC element 10 being a driver or receiver, there is a possibility for surge current to flow to the output terminal OUT or input terminal IN connected to an external device. In addition, when connecting like devices, there is a possibility for surge current to flow to the power terminal and ground terminal via the power terminal and ground terminal of the connector.

Figure 3:
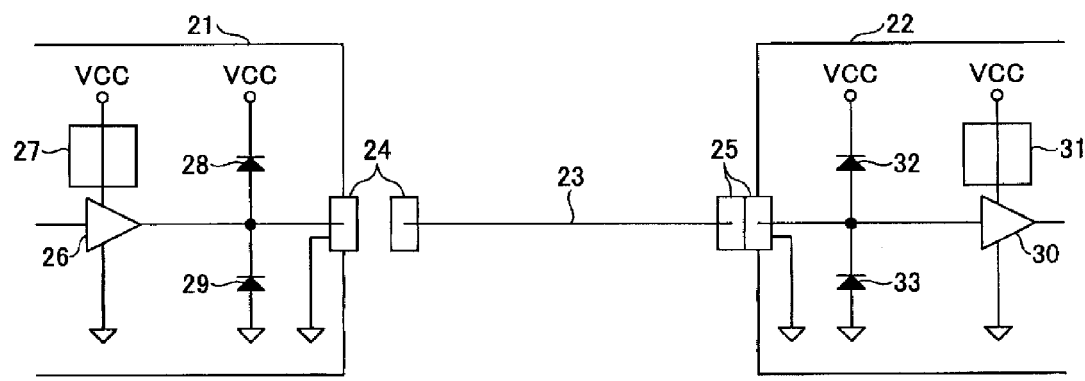
FIG. 3 is a view showing an example of a configuration connecting two devices via a communication interface.

FIG. 3 is a view showing an example of a configuration connecting two devices via a communication interface. The communication system shown in FIG. 3 includes an electronic device 21, electronic device 22, communication cable 23, connectors 24, and connectors 25. The electronic device 21 includes a driver IC 26, automatic reset fuse 27, and protection diodes 28 and 29. One of the connectors 24 (e.g., receptacle side) is attached to the electronic device 21, and the output end of the driver IC 26 is connected thereto. The protection diode 28 is inserted between the output end of the driver IC 26 and the power voltage VCC, and the protection diode 29 is inserted between the output end of the driver 26 and the ground voltage GND.

The electronic device 22 includes a driver IC 30, automatic reset fuse 31, and protection diodes 32 and 33. One of the connectors 25 (e.g., receptacle side) is attached to the electronic device 22, and the input end of the receiver IC 30 is connected thereto. The protection diode 32 is inserted between the input end of the receiver IC 30 and the power voltage VCC, and the protection diode 33 is inserted between the input end of the receiver IC 30 and the ground voltage GND.

In the state shown in FIG. 3, one of the connectors 24 (e.g., receptacle side) and the other one (e.g., plug side) on the electronic device 21 side are separated, and the cable 23 and connector 25 on the electronic device 22 side are connected. From this state, the electronic device 21 and the electronic device 22 are connected by connecting the connectors 24 via the communication cable 23. At this time, a surge current may flow to the output end of the driver IC 26 and the input end of the receiver IC 30, caused by the ground potential difference between the electronic device 21 and the electronic device 22, or the potential difference due to the electric charge accumulated in one of the devices from static electricity or the like. If the voltage caused thereby exceeds a voltage range of the signal voltage, this surge current will flow to the power voltage VCC or ground voltage via the protection diodes 28 and 29 or the protection diodes 32 and 33. It is thereby possible to prevent the driver IC 26 and receiver IC 30 from destruction caused directly by surge current to some extent. However, when latch-up occurs in the driver IC 26 and receiver 30 with this surge current as a trigger, a state is entered in which high current is allowed to flow from the power voltage VCC to the ground voltage. In a case of no latch-up protection being established whatsoever, this high current will flow continuously and a great amount of heat will generate, the silicon will burn and the wiring melt, whereby the devices of the driver IC 26 and receiver IC 30 will be destroyed. In other words, by simply implementing the protection diodes 28, 29, 32 and 33, it is not possible to prevent damage due to latch-up of the driver IC 26 and receiver IC 30.

In the communication system shown in FIG. 3, the automatic reset fuse 27 is provided on the driver IC 26 side, and the automatic reset fuse 31 is provided on the receiver IC 30 side. Therefore, even if a state is entered in which latch-up occurs in the driver IC 26 or receiver IC 30 and high current flows from the power voltage VCC to the ground voltage, the automatic reset fuse 27 or 31 will enter a cut-off state (or high resistance state) by the heat generation from the high current. It is thereby possible to avoid the driver IC 26 or receiver IC 30 from being destroyed by heat generation. It should be noted that, with the configuration shown in FIG. 3, the automatic reset fuses 27 are 37 are connected to the power voltage side of the corresponding IC elements 26 and 30, respectively. If the automatic reset fuse were connected to the ground voltage side of the IC element as shown in FIG. 2, there would be a possibility for a signal line of the device that is externally exposed at a communication connector portion to be fixed to the power voltage upon the automatic reset fuse entering a cut-off state accompanying latch-up occurrence. In contrast, with the communication system shown in FIG. 3, the signal line of the device that is externally exposed at a portion of the connector 24 or 25 will not be fixed at the power voltage upon the automatic reset fuses 27 and 31 entering a cut-off state accompanying latch-up occurrence. Therefore, operation of the device is stopped in a relatively safe state, even when latch-up occurs.

Although the automatic reset fuse is disposed between the target IC and the power voltage VCC in FIG. 3, it is also possible to dispose the automatic reset fuse between the target IC and the ground voltage GND, as explained using FIG. 2.

As described previously, the risk of latch-up occurring is high in a case of the IC element 10 being the driver or receiver of an interface for communication used for communication between devices. In particular, device failure for which latch-up is presumed to be the cause easily occurs in a device using a low voltage differential interface such as IEEE1394, HDMI (High-Definition Multimedia Interface), and USB (Universal Serial Bus). Therefore, from the viewpoint of avoiding device failure, a great effect can be expected from employing an automatic reset fuse in a device using such a low voltage differential interface.

Figure 4:
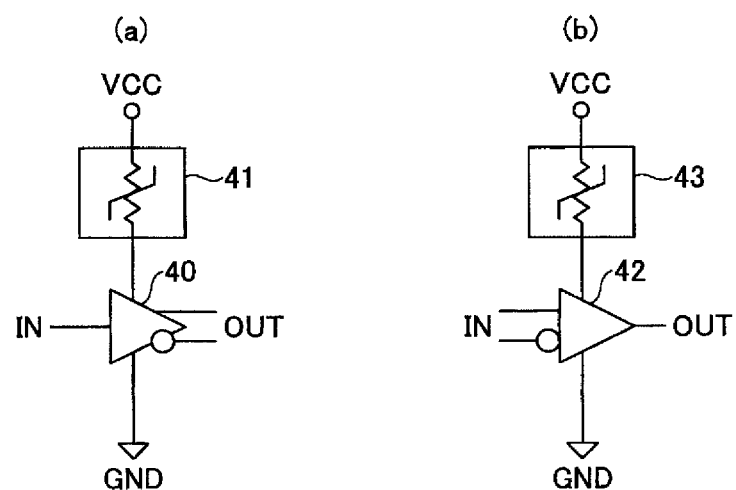
FIG. 4 is a view showing an example of an electronic circuit having a function of protecting the driver and receiver of a differential interface from excessive current caused by latch-up.

FIG. 4 is a view showing an example of an electronic circuit having a function of protecting the driver and receiver of a differential interface from excessive current caused by latch-up. FIG. 4(a) shows an electronic circuit on the driver side, and this electronic circuit includes an IC element 40, which is the driver of the differential interface, and an automatic reset fuse 41. The driver IC element 40 has a differential signal output OUT relative to a single-phase signal input IN. The automatic reset fuse 41 is inserted between the driver IC element 40 and power voltage VCC. Similarly to the configuration shown in FIG. 2, the automatic reset fuse 41 may be inserted between the driver IC element 40 and the ground voltage GND. FIG. 4(b) shows an electronic circuit on the receiver side, and this electronic circuit includes an IC element 42, which is the receiver of a differential interface, and an automatic reset fuse 43. The receiver IC element 42 has a single-phase signal output OUT relative to a differential signal input IN. The automatic reset fuse 43 is inserted between the receiver IC element 20 and power voltage VCC. Similarly to the configuration shown in FIG. 2, the automatic reset fuse 43 may be inserted between the receiver IC element 42 and the ground voltage GND. The occurrence of latch-up in the driver IC element 40 and receiver IC element 42 and the protection of the elements by the automatic reset fuses 41 and 43 are the same as the case explained with FIGS. 1 and 2.

Figure 5:
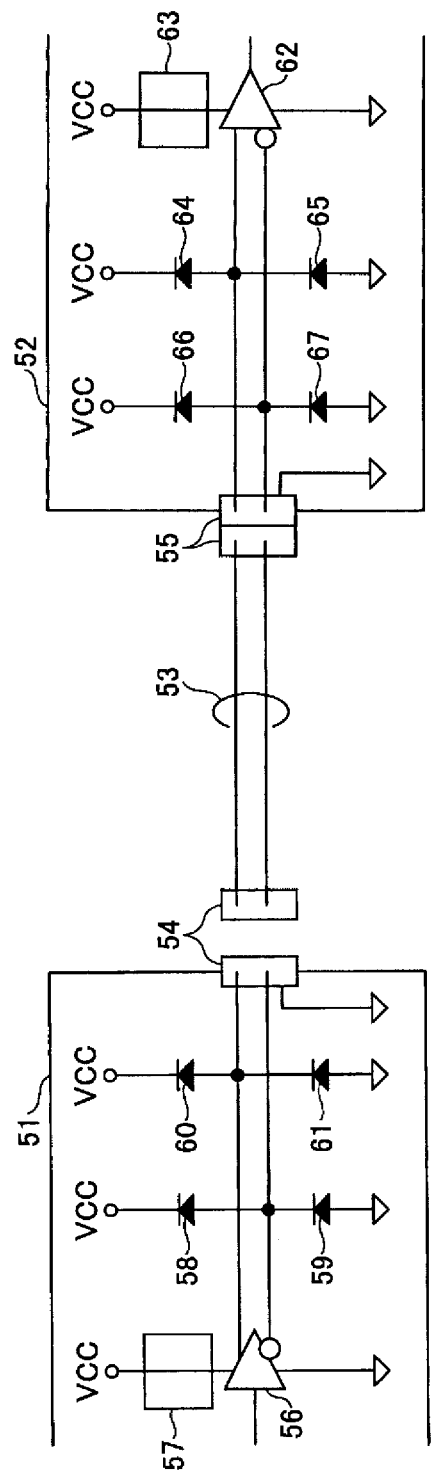
FIG. 5 is a view showing an example of a configuration connecting two devices via a differential communication interface.

FIG. 5 is a view showing an example of a configuration connecting two devices via a differential communication interface. The communication system shown in FIG. 5 includes an electronic device 51, electronic device 52, differential communication cable 53, connectors 54 and connectors 55. The electronic device 51 includes a driver IC 56, automatic reset fuse 57, and protection diodes 58 to 61. One of the connectors 54 (e.g., receptacle side) is attached to the electronic device 51, and the differential output end of the driver IC 56 is connected thereto. The protection diodes 58 and 60 are inserted between the differential output end of the driver IC 56 and the power voltage VCC, and the protection diodes 59 and 61 are inserted between the differential output end of the driver IC 56 and the ground voltage GND.

The electronic device 52 includes a receiver IC 62, automatic reset fuse 63, and protection diodes 64 to 67. One of the connectors 55 (e.g., receptacle side) is attached to the electronic device 52, and the differential input end of the receiver IC 62 is connected thereto. The protection diodes 64 and 66 are inserted between the differential input end of the receiver IC 62 and the power voltage VCC, and the protection diodes 65 and 67 are inserted between the differential input end of the receiver IC 62 and the ground voltage GND.

In the state shown in FIG. 5, one of the connectors 54 (e.g., receptacle side) and the other one (e.g., plug side) are separated. From this state, the electronic device 51 and the electronic device 52 are connected via the differential communication cable 53 by connecting the connectors 54. At this time, a surge current may be allowed to flow to the differential output end of the driver IC 56 and the differential input end of the receiver IC 62, caused by the ground potential difference between the electronic device 51 and the electronic device 52, or the potential difference due to the electric charge accumulated in one of the devices by static electricity or the like. If the voltage caused thereby exceeds a voltage range of the differential signal voltage, this surge current will flow to the power voltage VCC or ground voltage via the protection diodes 58 to 61 or the protection diodes 64 and 67. In the case of a low-voltage differential interface, since the operating voltage range of the signal voltage is relatively narrow, the voltage caused by surge current exceeds the voltage range of the differential signal voltage relatively easily. If latch-up occurs in the driver IC 56 or receiver IC 62 with this surge current as a trigger, a state will be entered in which high current flows from the power voltage VCC to the ground voltage.

However, the automatic reset fuse 57 is provided on the driver IC 56 side, and the automatic reset fuse 63 is provided on the receiver IC 62 side. Therefore, even if latch-up occurs in the driver IC 56 or receiver IC 62 and a state is entered in which high current flows from the power voltage VCC to the ground voltage, the automatic reset fuse 57 or 63 will generate heat due to the high current and enter a cut-off state (or high resistance state). It is thereby possible to avoid the driver IC 56 or receiver IC 63 being destroyed by the heat generation.

Generally, techniques of protecting circuits for which there is a possibility for overcurrent to flow by a fuse are widely known techniques. However, in a normal circuit board, it is not considered that IC elements for which the possibility of overcurrent to flow due to a specific cause (e.g., latch-up) is particularly high are especially protected, and a configuration is used in which the fuse is arranged at a main power port of the circuit board. In other words, a design concept is employed whereby the power source is collectively cutting off at the main if high current such that an element will be destroyed is allowed to flow.

However, since the fuse is arranged at the main power port, a standard fuse such that does not cut off with the maximum current consumed by the entire circuit from normal operation has been used. With such a circuit board, even if latch-up occurs in the driver IC element or receiver IC element of the communication interface portion, for example, it is common for the overcurrent caused by the latch-up not to become high enough current so as to cut off the fuse of the main. As a result, with a conventional circuit board, destruction of the IC element actually occurs due to latch-up, irrespective of whether an overcurrent protection function is built-in by way of a fuse.

In contrast, in addition to a function of protecting the circuit by arranging a fuse at the main power port, it is possible to precisely avoid damage caused by latch-up by protecting an IC element for which latch-up occurs particularly easily using an automatic reset fuse on the circuit board in a focused manner. Due to automatically recovering by the automatic reset fuse, it is not necessary to specify at what position a fuse has cut off on the circuit board. In regards to the fuse at the main power port, the position of the fuse is identified, and there is normally only one; therefore, the replacement operation is also easy, even if it is not of automatic resetting type. However, in a case such that an IC element for which latch-up easily occurs on the circuit board is protected in a focused manner, the position of the fuse is difficult to identify, and specifying which one among a plurality of fuses has cut off is necessary for the replacement operation. Therefore, in a case of protecting an IC element for which latch-up easily occurs on a circuit board in a focused manner, it is preferable to use an automatic reset fuse.

Figure 6:
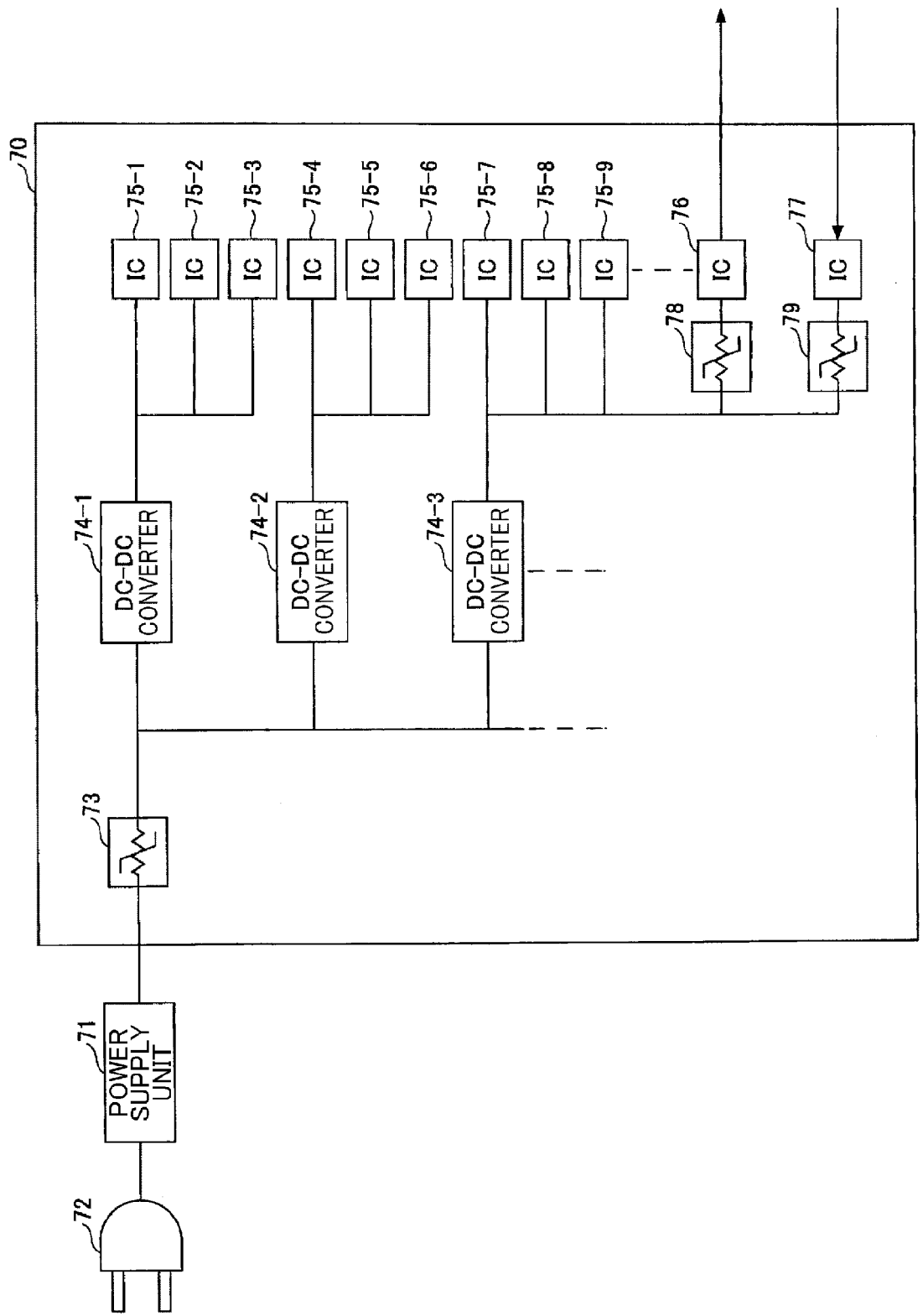
FIG. 6 is a view showing an example of a circuit board having an overcurrent protection function.

FIG. 6 is a view showing an example of a circuit board having an overcurrent protection function. The circuit board 70 shown in FIG. 6 receives commercial power from a power plug 72 via a power supply unit 71. The power supply unit 71 is an AC-DC converter, for example, and converts commercial alternating current power at 100 V to DC power voltage at 12 V, for example, and supplies this DC voltage to the circuit board 70. It should be noted that, although the power supply unit 71 is provided outside of the circuit board 70 in the configuration example of FIG. 6, it may be a configuration mounted on the circuit board 70.

The circuit board 70 includes a fuse 73, DC-DC converters 74-1 to 74-3, IC elements 75-1 to 74-9, communication driver element 76, communication receiver IC element 77, and resettable fuses 78 and 79. The DC-DC converters 74-1 to 74-3 receive DC power voltage at 12 V, for example, from the power supply unit 71 via the fuse 73. The DC-DC converters 74-1 to 74-3 generate power voltage at 5 V, 3.3 V, 1.8 V, etc. by stepping down the DC power voltage of 12 V, for example. The DC power voltage generated by the DC-DC converter 74-1 is supplied to the IC elements 75-1 to 75-3. The DC power voltage generated by the DC-DC converter 74-2 is supplied to the IC elements 75-4 to 75-6. The DC power voltage generated by the DC-DC converter 74-3 is supplied to the IC elements 75-7 to 75-9 as well as the driver IC element 76 and receiver IC element 77.

The driver IC element 76 and receiver IC element 77 are a driver and receiver of a differential interface for communication, for example, and are CMOS devices in which latch-up can occur. The DC-DC converter 74-3 functions as a voltage generating circuit that generates DC power voltage, which is a voltage level that drives the IC elements such as the driver IC element 76 and the receiver IC element 77. The resettable fuse 78 is provided between the DC-DC converter 74-3 and the driver IC element 76, and the resettable fuse 79 is provided between the DC-DC converter 74-3 and the receiver IC element 77. The fuse 73, which is separate from these resettable fuses, is mounted to the circuit board 70, and is inserted in a path applying input voltage to the DC-DC converter 74-3. This fuse 73 is inserted in the path supplying the common voltage to the DC-DC converter 74-3 and a plurality of other circuits (e.g., DC-DC converters 74-1 and 74-2 and IC elements 75-1 to 75-6).

The fuse 73 is provided in order to provide an overcurrent protection function at the main power port of the circuit board 70. Since the fuse is arranged at the main power port, a standard fuse that does not cut off at the maximum current consumed by the overall circuit board 70 from normal operation is used. Therefore, even if latch-up occurs in the driver IC element 76 or receiver IC element 77, the overcurrent caused by the latch-up will not be so high current as to interrupt the main fuse 73. Therefore, in addition to the function of protecting circuits by arranging the fuse 73 at a power supply position of the base, the driver IC element 76 and receiver IC element 77 for which latch-up occurs particularly easily are protected by the resettable fuses 78 and 79 on the circuit board 70 in a focused manner. It is thereby possible to precisely avoid damage cause by latch-up. Since the resettable fuses 78 and 79 automatically recover according to a temperature decline, there is no need to examine the circuit board 70 after latch-up has been eliminated, and it can be used as is.

Figure 7:
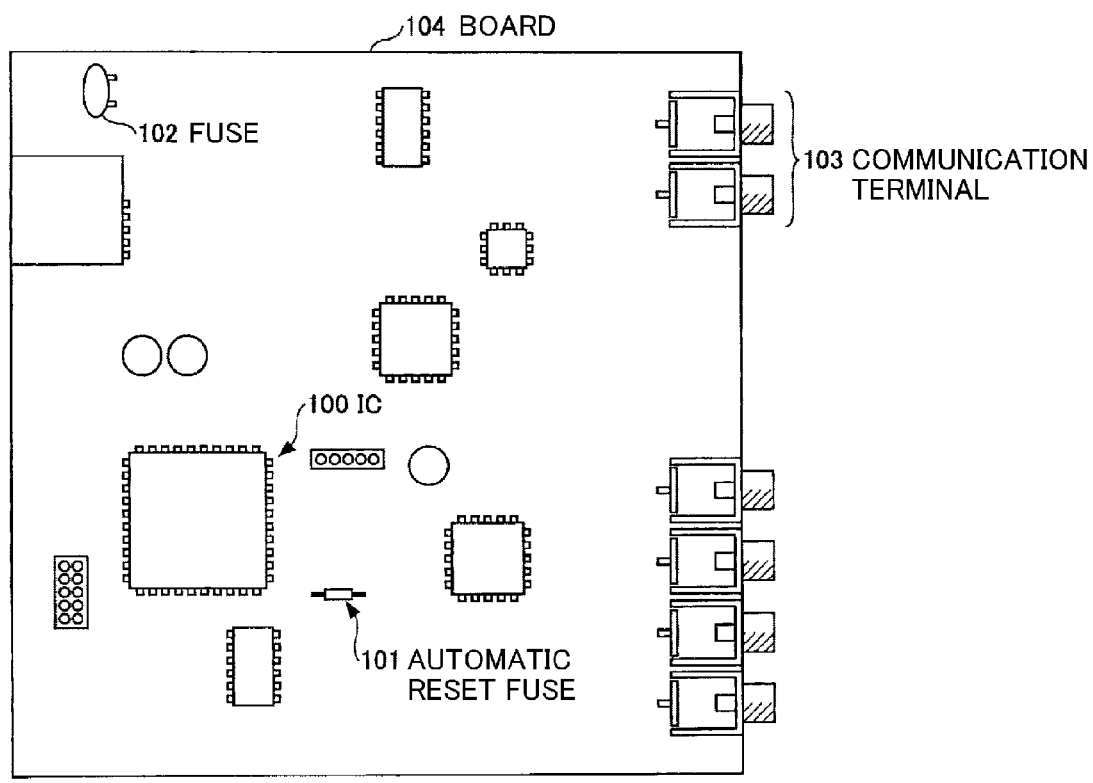
FIG. 7 is a view showing an example of the appearance of a circuit board having an overcurrent protection function.

FIG. 7 is a view showing an example of an appearance of a circuit board having an overcurrent protection function. A communication IC 100, automatic reset fuse 101, fuse 102, and communication terminal 103 are provided to a board 104 shown in FIG. 7. The fuse 102 provides a protection function against overcurrent at the power support position of the base of the board 104, and corresponds to the fuse 73 in FIG. 6. The communication IC 100 is a transceiver IC element for an interface having a driver function and receiver function, and includes the driver IC element 76 and receiver IC element 77 of FIG. 6. The automatic reset fuse 101 is connected to a power voltage terminal of the communication IC 100. Power supplied from outside is supplied to the communication IC 100 via the fuse 102, DC-DC converter, etc., and further through the automatic reset fuse 101. The communication IC 100 is driven by the power voltage applied via the automatic reset fuse 101, and performs transmission and reception of signals via the communication terminal 103. The automatic reset fuse 101 is a resettable fuse, for example, and in a case of latch-up having occurred at the communication IC 100 with surge current flowing through the communication terminal 103 as a trigger, for example, will generate heat and enter a high resistance state, whereby the communication IC 100 is protected from high current.

Although the present invention has been explained based on the embodiments above, the present invention is not to be limited to the above embodiments, and various modifications within the scope described in the claims are possible.

The following appendix is further disclosed in relation to all of the above embodiments.

The invention claimed is:

1. An electronic circuit comprising:
   a substrate
   an IC element mounted on the substrate and having a first terminal connecting to power voltage and a second terminal connecting to ground voltage;
   a voltage generating circuit mounted on the substrate that generates the power voltage that is a voltage level driving the IC element;
   at least one circuit mounted on the substrate;
   an automatic reset fuse mounted on the substrate and connected between the power generating circuit and the IC element; and
   a second fuse mounted on the substrate and inserted in a path applying input voltage to the voltage generating circuit and being inserted in a path supplying common voltage to the voltage generating circuit and the at least one circuit.

2. An electronic circuit according to claim 1, wherein the automatic reset fuse is a PTC element.

3. An electronic circuit according to anyone of claims 1 or 2, wherein the IC element is CMOS.

4. An electronic circuit according to anyone of claims 1 or 2, wherein the IC element is an element in which latch-up can occur.

5. An electronic circuit according to anyone of claims 1 or 2, wherein the IC element is anyone of a driver and a receiver of an interface for communication.

6. An electronic circuit according to anyone of claims 1 or 2, wherein the IC element is anyone of a driver and receiver of a low-voltage differential interface for communication.

7. An electronic circuit according to anyone of claims 1 or 2, wherein the automatic reset fuse is inserted between the IC element and the power voltage.

8. An electronic circuit according to anyone of claims 1 or 2, wherein the automatic reset fuse is inserted between the IC element and the ground voltage.

9. The electronic circuit according to claim 1, wherein the automatic reset fuse is directly connected to the IC element.

10. An electronic circuit according to claim 1, wherein the IC element is a driver of a low-voltage differential interface for communication, the electronic circuit further comprising:

a second IC element mounted on the substrate having a terminal connecting to power voltage and a terminal connecting to ground voltage, the second IC element being a receiver of a low-voltage differential interface for communication; and a second automatic reset fuse mounted on the substrate and connected between the power generating circuit and the second IC element.

* * * * *